(12) United States Patent
Roth et al.

(10) Patent No.: US 8,900,482 B2
(45) Date of Patent: *Dec. 2, 2014

(54) LIGHT EMITTING DEVICE

(71) Applicant: Seoul Semiconductor Co., Ltd., Seoul (KR)

(72) Inventors: Gundula Roth, Levenhagen (DE);
Walter Tews, Greifswald (DE);
Chung-Hoon Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/665,744

(22) Filed: Oct. 31, 2012

(65) Prior Publication Data

US 2013/0049574 A1    Feb. 28, 2013

Related U.S. Application Data

(63) Continuation of application No. 12/491,457, filed on Jun. 25, 2009, now Pat. No. 8,318,044, which is a continuation-in-part of application No. 11/948,845, filed on Nov. 30, 2007, now Pat. No. 8,066,909, which is a continuation-in-part of application No. 11/024,702, filed on Dec. 30, 2004, now Pat. No. 7,554,129.

(30) Foreign Application Priority Data

Jun. 10, 2004   (KR) .................. 10-2004-0042396

(51) Int. Cl.
*H01L 33/50*     (2010.01)
*C09K 11/77*     (2006.01)
*C09K 11/75*     (2006.01)
*C09K 11/66*     (2006.01)

(52) U.S. Cl.
CPC ........... *C09K 11/665* (2013.01); *C09K 11/7739* (2013.01); *C09K 11/7738* (2013.01); *C09K 11/756* (2013.01); *C09K 11/7735* (2013.01); *C09K 11/753* (2013.01); *C09K 11/7796* (2013.01); *C09K 11/774* (2013.01); *C09K 11/7751* (2013.01); *C09K 11/7792* (2013.01); *H01L 33/502* (2013.01); *C09K 11/7734* (2013.01); *C09K 11/7756* (2013.01); *C09K 11/666* (2013.01)
USPC ....... 252/301.4 R; 252/301.4 F; 252/301.4 H; 252/301.6 R; 252/301.6 F; 313/503; 257/98

(58) Field of Classification Search
USPC ......... 257/98; 313/503; 252/301.4 R–301.6 F
See application file for complete search history.

(56) References Cited

U.S. PATENT DOCUMENTS

| | | |
|---|---|---|
| 2,110,162 A | 3/1938 | Leverenz |
| 2,402,760 A | 6/1946 | Leverenz |
| 2,570,136 A | 10/1951 | Lyon |
| 2,617,773 A | 11/1952 | Nagy et al. |
| 2,719,128 A | 9/1955 | Kressin |
| 2,780,600 A | 2/1957 | Wollentin |
| 3,143,510 A | 8/1964 | Wanmaker et al. |
| 3,598,752 A | 8/1971 | Sisneros |
| 3,644,212 A | 2/1972 | McAllister et al. |
| 3,893,939 A | 7/1975 | De Kalb et al. |
| 3,905,911 A | 9/1975 | Kelsey, Jr. et al. |
| 4,215,289 A | 7/1980 | De Hair et al. |
| 4,770,950 A | 9/1988 | Ohnishi |
| 4,810,416 A | 3/1989 | Hase |
| 4,972,086 A | 11/1990 | Bryan et al. |
| 5,032,316 A | 7/1991 | Takahashi et al. |
| 5,060,118 A | 10/1991 | Penrod et al. |
| 5,188,763 A | 2/1993 | Chenot et al. |
| 5,433,295 A | 7/1995 | Murphy |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |

(Continued)

FOREIGN PATENT DOCUMENTS

| | | |
|---|---|---|
| AT | 410266 | 3/2003 |
| CN | 1218084 | 6/1999 |

(Continued)

OTHER PUBLICATIONS

Preliminary Notice of First Office Action with Search Report issued on May 15, 2013 in Taiwanese Patent Application No. 095147024.

(Continued)

*Primary Examiner* — Carol M Koslow
(74) *Attorney, Agent, or Firm* — H.C. Park & Associates, PLC

(57) ABSTRACT

A light emitting device is disclosed. The light emitting device may include a light emitting diode (LED) for emitting light and phosphor adjacent to the LED. The phosphor may be excitable by light emitted by the LED and may include a first compound having a host lattice comprising first ions and oxygen. In one embodiment, the host lattice may include silicon, the copper ions may be divalent copper ions and first compound may have an Olivin crystal structure, a β-K2SO4 crystal structure, a trigonal Glaserite ($K_3Na(SO_4)_2$) or monoclinic Merwinite crystal structure, a tetragonal Ackermanite crystal structure, a tetragonal crystal structure or an orthorhombic crystal structure. In another embodiment, the copper ions do not act as luminescent ions upon excitation with the light emitted by the LED.

6 Claims, 4 Drawing Sheets

(56) References Cited

U.S. PATENT DOCUMENTS

| | | | |
|---|---|---|---|
| 5,965,192 A | 10/1999 | Potter | |
| 5,998,925 A | 12/1999 | Shimizu et al. | |
| 6,045,722 A | 4/2000 | Leblans et al. | |
| 6,066,861 A | 5/2000 | Hohn et al. | |
| 6,084,250 A | 7/2000 | Justel et al. | |
| 6,373,184 B1 | 4/2002 | Suh et al. | |
| 6,472,765 B1 | 10/2002 | Sano et al. | |
| 6,482,664 B1 | 11/2002 | Lee et al. | |
| 6,565,771 B1 | 5/2003 | Ono et al. | |
| 6,670,751 B2 | 12/2003 | Song et al. | |
| 6,686,691 B1 | 2/2004 | Mueller et al. | |
| 6,842,664 B2 | 1/2005 | Harada et al. | |
| 6,982,045 B2 | 1/2006 | Menkara et al. | |
| 6,982,048 B1 | 1/2006 | Atwater et al. | |
| 6,987,353 B2 | 1/2006 | Menkara et al. | |
| 7,009,199 B2 | 3/2006 | Hall | |
| 7,019,335 B2 | 3/2006 | Suenaga | |
| 7,029,602 B2 | 4/2006 | Oshio | |
| 7,045,078 B2 | 5/2006 | Choi | |
| 7,138,770 B2 | 11/2006 | Uang et al. | |
| 7,189,340 B2 * | 3/2007 | Shimomura et al. | 252/301.4 F |
| 7,204,607 B2 | 4/2007 | Yano | |
| 7,206,507 B2 | 4/2007 | Lee et al. | |
| 7,229,571 B2 | 6/2007 | Ezuhara et al. | |
| 7,244,965 B2 | 7/2007 | Andrews et al. | |
| 7,332,746 B1 | 2/2008 | Takahashi et al. | |
| 7,468,147 B2 | 12/2008 | Shida et al. | |
| 7,554,129 B2 | 6/2009 | Roth et al. | |
| 7,608,200 B2 | 10/2009 | Seto et al. | |
| 7,679,101 B2 | 3/2010 | Ota et al. | |
| 7,679,281 B2 | 3/2010 | Kim et al. | |
| 8,066,909 B2 | 11/2011 | Roth et al. | |
| 8,070,983 B2 * | 12/2011 | Roth et al. | 252/301.4 R |
| 8,070,984 B2 | 12/2011 | Roth et al. | |
| 8,075,802 B2 * | 12/2011 | Roth et al. | 252/301.4 R |
| 8,089,084 B2 | 1/2012 | Roth et al. | |
| 8,137,589 B2 * | 3/2012 | Lee et al. | 252/301.4 R |
| 8,318,044 B2 * | 11/2012 | Lee et al. | 252/301.4 R |
| 8,431,954 B2 * | 4/2013 | Lee et al. | 257/100 |
| 2002/0015013 A1 | 2/2002 | Ragle | |
| 2003/0030063 A1 | 2/2003 | Sosniak et al. | |
| 2003/0038295 A1 | 2/2003 | Koda | |
| 2003/0168636 A1 | 9/2003 | Dobson et al. | |
| 2004/0051111 A1 | 3/2004 | Ota et al. | |
| 2004/0079957 A1 | 4/2004 | Andrews et al. | |
| 2004/0104391 A1 | 6/2004 | Maeda et al. | |
| 2004/0135504 A1 | 7/2004 | Tamaki et al. | |
| 2004/0136891 A1 | 7/2004 | Kijima et al. | |
| 2004/0206970 A1 | 10/2004 | Martin | |
| 2004/0251809 A1 | 12/2004 | Shimomura et al. | |
| 2005/0001225 A1 | 1/2005 | Yoshimura et al. | |
| 2005/0001537 A1 | 1/2005 | West et al. | |
| 2005/0029927 A1 | 2/2005 | Setlur et al. | |
| 2005/0117334 A1 | 6/2005 | Lee et al. | |
| 2005/0139846 A1 | 6/2005 | Park et al. | |
| 2005/0141048 A1 | 6/2005 | Mizutani | |
| 2005/0239227 A1 | 10/2005 | Aanegola et al. | |
| 2005/0264161 A1 | 12/2005 | Oaku et al. | |
| 2005/0274930 A1 | 12/2005 | Roth et al. | |
| 2005/0274972 A1 | 12/2005 | Roth et al. | |
| 2006/0076883 A1 | 4/2006 | Himaki et al. | |
| 2006/0158090 A1 | 7/2006 | Wang et al. | |
| 2006/0261309 A1 | 11/2006 | Li et al. | |
| 2006/0261350 A1 | 11/2006 | Kawazoe et al. | |
| 2006/0267042 A1 | 11/2006 | Izuno et al. | |
| 2007/0029526 A1 | 2/2007 | Cheng et al. | |
| 2007/0247051 A1 | 10/2007 | Kuze et al. | |
| 2007/0284563 A1 | 12/2007 | Lee et al. | |
| 2008/0036364 A1 | 2/2008 | Li et al. | |
| 2008/0067472 A1 | 3/2008 | Roth et al. | |
| 2008/0067920 A1 | 3/2008 | Roth et al. | |
| 2008/0224163 A1 | 9/2008 | Roth et al. | |
| 2009/0050847 A1 | 2/2009 | Xu et al. | |
| 2009/0050849 A1 | 2/2009 | Lee et al. | |
| 2009/0134413 A1 | 5/2009 | Roth et al. | |
| 2009/0152496 A1 | 6/2009 | Roth et al. | |
| 2009/0262515 A1 | 10/2009 | Lee et al. | |
| 2009/0303694 A1 | 12/2009 | Roth et al. | |
| 2010/0002454 A1 | 1/2010 | Lee et al. | |
| 2010/0165645 A1 | 7/2010 | Lee et al. | |
| 2010/0207132 A1 | 8/2010 | Lee et al. | |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 2624578 | 7/2004 |
| CN | 1581503 | 2/2005 |
| CN | 2690724 | 4/2005 |
| CN | 1702809 | 11/2005 |
| CN | 1706043 | 12/2005 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0765925 | 4/1997 |
| EP | 0862794 | 9/1998 |
| EP | 0896994 | 2/1999 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 5-78659 | 3/1993 |
| JP | 9-40946 | 2/1997 |
| JP | 9-153644 | 6/1997 |
| JP | 9-279140 | 10/1997 |
| JP | 10-321914 | 12/1998 |
| JP | 11-177143 | 7/1999 |
| JP | 2000-260580 | 9/2000 |
| JP | 2000-294387 | 10/2000 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97465 | 4/2002 |
| JP | 2002-97466 | 4/2002 |
| JP | 2002-173677 | 6/2002 |
| JP | 2002-335019 | 11/2002 |
| JP | 2002-359403 | 12/2002 |
| JP | 2002-368277 | 12/2002 |
| JP | 2003-064358 | 3/2003 |
| JP | 2003-133595 | 5/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-071726 | 3/2004 |
| JP | 2004-71807 | 3/2004 |
| JP | 2004-079867 | 3/2004 |
| JP | 2004-88011 | 3/2004 |
| JP | 2004-127988 | 4/2004 |
| JP | 2004-134699 | 4/2004 |
| JP | 2004-192833 | 7/2004 |
| JP | 2001-115157 | 12/2004 |
| JP | 2005-100799 | 4/2005 |
| JP | 2005-100800 | 4/2005 |

(56) References Cited

FOREIGN PATENT DOCUMENTS

| | | |
|---|---|---|
| JP | 2005-101296 | 4/2005 |
| JP | 2005-153606 | 6/2005 |
| JP | 2005-167177 | 6/2005 |
| JP | 2005-354027 | 12/2005 |
| JP | 2006-073656 | 3/2006 |
| JP | 2006-173433 | 6/2006 |
| JP | 2006-252944 | 9/2006 |
| JP | 2007-186674 | 7/2007 |
| JP | 2009-007545 | 1/2009 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-0392363 | 7/2002 |
| KR | 10-2002-0079513 | 10/2002 |
| KR | 10-2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0117164 | 12/2005 |
| KR | 10-2006-0034056 | 4/2006 |
| KR | 10-0626272 | 9/2006 |
| KR | 10-2006-0134728 | 12/2006 |
| KR | 10-2007-0016900 | 2/2007 |
| KR | 10-2007-0050833 | 5/2007 |
| KR | 10-2007-0084659 | 8/2007 |
| KR | 10-2007-0086483 | 8/2007 |
| KR | 10-2008-0046789 | 5/2008 |
| KR | 10-2008-0074241 | 7/2008 |
| KR | 10-2008-0075181 | 7/2008 |
| TW | I328885 | 3/1999 |
| TW | 546854 | 8/2003 |
| WO | 96-32457 | 10/1996 |
| WO | 98-05078 | 2/1998 |
| WO | 98-12757 | 3/1998 |
| WO | 98-39805 | 9/1998 |
| WO | 98-42798 | 10/1998 |
| WO | 00-19546 | 4/2000 |
| WO | 00/33390 | 6/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 03/030274 | 4/2003 |
| WO | 2004/036962 | 4/2004 |
| WO | 2004/038801 | 5/2004 |
| WO | 2004-085570 | 10/2004 |
| WO | 2004-111156 | 12/2004 |
| WO | 2005-068584 | 7/2005 |
| WO | 2005-112137 | 11/2005 |
| WO | 2005109532 | 11/2005 |
| WO | 2006-043682 | 4/2006 |
| WO | 2006-068359 | 6/2006 |
| WO | 2006-081803 | 8/2006 |
| WO | 2006/109659 | 10/2006 |
| WO | 2007-035026 | 3/2007 |
| WO | 2007-055538 | 5/2007 |
| WO | 2007055538 | 5/2007 |
| WO | 2007-069869 | 6/2007 |
| WO | 2007-114614 | 11/2007 |
| WO | 2009028818 | 3/2009 |

OTHER PUBLICATIONS

Non-Final Office Action of related U.S. Appl. No. 13/555,882 was mailed Mar. 13, 2013.
International Search Report for PCT/KR2010/003302 issued on Jan. 3, 2011, corresponding to U.S. Appl. No. 12/767,253.
Final Office Action dated Dec. 8, 2010 in U.S. Appl. No. 11/948,813.
Final Office Action dated Dec. 23, 2010 in U.S. Appl. No. 11/569,060.
Non Final Office Action dated Dec. 29, 2010 in U.S. Appl. No. 12/731,811.
Final Office Action dated Dec. 7, 2010 in U.S. Appl. No. 11/948,845.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
G. Blasse, B.C. Grabmeier, "Luminescent Materials", Springer, 1994, 87-90.
Notice of Allowance dated Aug. 18, 2010 in U.S. Appl. No. 12/098,263.
Final Office Action dated May 11, 2010 in U.S. Appl. No. 12/098,263.
Non Final Office Action dated Mar. 17, 2010 in U.S. Appl. No. 11/024,722.
Non Final Office Action dated Aug. 17, 2010 in U.S. Appl. No. 11/948,845.
EP Search Report dated Sep. 1, 2010 in EP Appl No. 08015119 corresponding to U.S. Appl. No. 12/440,001.
EP Search Report dated Oct. 6, 2010 in EP Appl. No. 07745750.5—corresponding to U.S. Appl. No. 12/295,438.
Non Final Office Action dated Jun. 16, 2010 in U.S. Appl. No. 12/097,741.
Final Office Action dated Nov. 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
Tomas L. Barry "Equilibria and Eu2+ luminescence of subsolidus phases bounded by Ba3MgSi2O8, Sr3MgSi2O8 and Ca3MgSi2O8" pp. 733-738 vol. 115, No. 7 J. Electrochem Soc.: Solid State Sceince Jul. 1968.
Non-final office action dated Nov. 29, 2006 issued in U.S. Appl. No. 11/024,722, filed Dec. 30, 2004.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl. No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.
Non-final office action dated May 29, 2009 issued in U.S. Appl. No. 11/024,722, filed Dec. 30, 2004.
Notice of Allowance dated May 4, 2009 issued in U.S. Appl. No. 11/024,702.
Non-final office action dated Nov. 29, 2007 issued in U.S. Appl. No. 11/024,702, filed Dec. 30, 2004.
Non-final office action dated Aug. 12, 2009 issued in U.S. Appl. No. 11/569,060, filed Jun. 22, 2007.
Non-final office action dated Jan. 13, 2010 issued in U.S. Appl. No. 11/569,060, filed Jun. 22, 2007.
Non-final office action dated Nov. 17, 2009 issued in U.S. Appl. No. 12/097,741, filed Oct. 9, 2008.
Bogner et al., DE 102 33 050 A1, Feb. 5, 2004, Machine Traslation.
Final office action dated Feb. 7, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Final office action dated Oct. 28, 2009 issued in U.S. Appl. No. 11/024,722, filed Dec. 30, 2004.

(56) References Cited

OTHER PUBLICATIONS

Non-final office action dated May 23, 2007 issued in U.S. Appl. No. 11/024,722, filed Dec. 30, 2004.
Non-final office action dated Nov. 14, 2008 issued in U.S. Appl. No. 11/024,722, filed Dec. 30, 2004.
Non-final office action dated Nov. 2, 2009 issued in U.S. Appl. No. 12/098,263.
Ralchenko, Yu., Kramida, A.E., Reader, J. and NIST ASD Team (2008). NIST Atomic Spectra Database (version 3.1.5), [Online]. Available: http://physics.nist.gov/asd3 [Feb. 27, 2009]. National Institute of Standards and Technology, Gaithersburg, MD.
N. S. Akhmetov, "Inorganic Chemistry", Moscow "Vysshaya Shkola", 1975; (partial translation; translated pp. 332-3, 372-3, 384-5, 427, 432, 436, 445, 471, 476, 486, 491, 496-7, 501, 546-9).
Markovsky L, Ya. Et al., Phosphors (Moscow-Leningrad, Khimiya Publishers, 1966, p. 7 (partial translation).
Search Report dated Apr. 11, 2006 for EP Application No. EP04106880.0.
Search Report dated Nov. 5, 2008 for EP Application No. EP06812549.1.
Search Report dated Aug. 21, 2007 for EP Application No. EP04106882.6.
Final Office Action of U.S. Appl. No. 12/854,001 issued on Oct. 11, 2011.
International Search Report dated Jul. 12, 2007 for PCT Application No. PCT/KR2007/001587.
International Search Report dated Mar. 21, 2007 for PCT Application No. PCT/KR2006/005500.
International Search Report dated Feb. 20, 2007 for PCT Application No. PCT/KR2006/004716.
International Search Report dated Oct. 24, 2005 for PCT Application No. PCT/KR2005/002332.
International Search Report dated Oct. 13, 2005 for PCT Application No. PCT/KR2005/002333.
International Search Report dated Aug. 12, 2005 for PCT Application No. PCT/KR2005/001288.
International Search Report dated Aug. 12, 2005 for PCT Application No. PCT/KR2005/001287.
International Search Report dated Feb. 27, 2009 for PCT Application No. PCT/KR2008/004734.
International Search Report dated Feb. 11, 2009 for PCT Application No. PCT/KR2008/004733.
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting Ba3SiO5:EU2+ Phosphor", Journal of Materials Science 40 (2005), pp. 2069-2071, XP-002511068.
Search Report dated Feb. 2, 2009 for EP Application No. EP08014684.
S.D. Jee, et al., "Photoluminescence properties of Eu2+—activated Sr3SiO5 Phosphors," J. Mater Sci. 41 (2006), pp. 3139-3141.
G. Blasse, et al., "Fluorescence of Europium2+—activated silicates," Philips Res. Repts 23 (1968), pp. 189-199.
G. Roth, et al. "Advanced Silicate Phosphors for improved white LED", Global Phosphor Summit Seoul/Korea, Mar. 5-7, 2007.
Non-Final Office Action dated Apr. 24, 2012 issued for U.S. Appl. No. 12/854,001.
H.G. Kang, et al., "Embodiment and Luminescence Properties of Sr3SiO5:Eu(yellow-orange phosphor) by co-doping lanthanide", Solid State Phenomena, vol. 124-126 (2007) pp. 511-514.
T.L. Barry, "Fluorescence of Eu2+ Activated Phases in Binary Alkaline Earth Orthosilicate Systems", J. Electrochem Soc., Nov. 1968, pp. 1181-1184.
Chinese Office Action corresponding to Patent App No. 2005800150173 dated Dec. 28, 2007.
Final OA dated Oct. 22, 2007 issued in U.S. Appl. No. 11/024,722.
Office Action dated Dec. 28, 2007 corresponding to China App No. 200580016844.4.
X. W. Sun et al., "Pulsed Laser Deposition of Silicate Phosphor Thin Films", Appl. Phys. A 69, 1999, 5 pp.
W.L. Wanmaker et al. "Luminescence of Phosphors Based on the Host Lattice ABGe2O6 (A, B=Ca, Sr, Ba)" Journal of Solid State Chemistry 3, (1971), pp. 194-196.
Declaration under CFR 1.132 for related U.S. Appl. No. 11/024,722 dated Aug. 24, 2007.
Non-Final OA mailed May 23, 2007 for U.S. Appl. No. 11/024,722 entitled "Luminescent Material".
Ageeth A. Bol et al., "Luminescence of ZnS:Cu2+", Journal of Luminescence, No. 99, 2002, pp. 325-334.
J.F. Suyver et al., "Luminescence of nanocrystalline ZnSe:Cu", Applied Physics Letters, vol. 79, No. 25, Dec. 17, 2001, pp. 4222-4224.
Ping Yang et al., "Photoluminescence of Cu+-doped and Cu2+-doped ZnS nanocrystallites", Journal of Physics and Chemistry of Solids, No. 63, 2002, pp. 638-643.
S. Shionoya et al., (Eds.), "Principal phosphor materials and their optical properties" in Phosphor Handbook, CRC Press, 1999, pp. 231-255.
A. Scacco et al., "Optical Spectra of Cu2+ Ions in LiF Crystals", Radiation Effects and Defects in Solids, vol. 134, 1995, pp. 333-336.
Lujcan Dubicki et al., "The First d-d Fluorescence of a Six-Coordinate Copper (II) Ion", J. Am. Chem. Soc. 1989, No. 111, pp. 3452, 3454.
A.B.P. Lever, "Inorganic Electronic Spectroscopy", 2nd ed., Elsevier, 1984, pp. 355 and 557-559.
A.G. Shenstone, "The Third Spectrum of Copper (Cu III)", Journal of Research of the National Bureau of Standards—A. Physics and Chemistry, vol. 79A, No. 3, May-Jun. 1975, pp. 497-521.
First Office Action of the PRC to Chinese Patent App No. 20051002304.2 dated Feb. 15, 2008.
Yang, "Up—Conversion Fluorescence in Er3 + Yb3 + Co—Doped Oxy—Fluoride Compound Materials Based on GeO2", Natural Science Journal of Xiangtan University, vol. 23, No. 2, 2001, pp. 37-41.
Bernhardt, Investigations of the Orange Luminescence of PbMo04 Crystals, Phys. Stat. Sol (a), 91, 643, 1985, pp. 643-647.
Butler, "Fluorescent Lamp Phosphors", The Pennsylvania State University Press, 1980, pp. 175-176.
Butler, "Fluorescent Lamp Phosphors", The Pennsylvania State University Press, 1980, pp. 181-182.
Wanmaker, et al., "Luminescence of Copper-Activated Orthophosphates of the Type ABPO (A=Ca, Sr, or Ba and B=Li, Na or K)", Journal of the Electrochemical Society, vol. 109, No. 2, pp. 109-113 (Feb. 1962).
Butler, "Fluorescent Lamp Phosphors", The Pennsylvania State University Press, 1980, pp. 281-284.
"Phosphors for Mercury Lamps" https:/www.lamptech.co.uk/Docuemnts/M14%20Phosphors.htm 2003 (2 pages).
Blasse, "Radiationless Processes in Luminescent Materials", Radiationless Processes, 1980, pp. 287-289, 293.
Shinonoya, "Phosphor Handbook", edited under the auspice of Phosphor Research Society, CRC Press, 1999, pp. 204-205.
Shinonoya, "Phosphor Handbook", edited under the auspice of Phosphor Research Society, CRC Press, 1999, p. 238-239, 241.
Wanmaker, et al., "Luminescence of Copper-Activated Calcium and Strontium Orthophosphates", Journal of the Electrochemical Society, vol. 106, No. 12, pp. 1027-1031 (Dec. 1959).
van Gool, "Philips Res. Rept. Suppl." 3, 1, 1961, pp. 1-9, 30-51, 84-85.
Declaration Under Rule 37 CFR 1.132 of Ulrich Kynast dated Sep. 6, 2008.
Notice of Allowance of U.S. Appl. No. 12/098,263 issued on Oct. 11, 2011.
Feldmann C., "Inorganic Luminescent Materials: 100 Years of Research and Application", Adv. Funct. Matter, 2003, pp. 511-516.
B. Cordero, V. Gómez, A. E. Platero-Prats, M. Revés, J. Echeverría, E. Cremades, F. Barragán, and S. Alvarez, "Covalent radii revisted", Dalton Trans., (2008), pp. 2832-2838.
R.J. Angel et al., "Structure and twinning of single-crystal MgSiO3 garnet synthisized at 17 GPa and 1800 ° C.", American Mineralogist, 74 (1989) pp. 509-512.

(56) References Cited

OTHER PUBLICATIONS

G.L. Miessler & D.A. Tarr, "Inorganic Chemistry", 3rd ed., Pearson / Prentice Hall, New Jersey, pp. 117-118 (2004).
P.A. Cox, "Transition Metal Oxides", Oxford University Press, 1995, p. 105.
Garcia Solé, L.E. Bausá, D. Jaque, "An Introduction to the Optical Spectroscopy of Inorganic Solids", Wiley, 2005, pp. 163-164.
G. Blasse, B.C. Grabmeier, "Luminescent Materials", Springer, 1994, p. 25.
S. Shionoya, W.M. Yen, "Phospher Handbook" CRC press, 1999, ch. 3.3, pp. 183-184.
Garcia Solé, L.E. Bausá, D. Jaque, "An Introduction to the Optical Spectroscopy of Inorganic Solids", Wiley, 2005, pp. 132-133.
S. Shionoya, W.M. Yen, "Phosphor Handbook" CRC press, 1999, ch. 3.3, pp. 179-182.
G. Blasse, "Characteristic Luminescence", Philips Technical Review, vol. 31, 1970, pp. 304-332.
G. Blasse, B.C. Grabmeier, "Luminescent Materials", Springer, 1994, pp. 40-47.
R. Chen, et al., "Developments in Luminescence and Display Materials Over the Last 100 Years as Reflected in Electrochemical Society Publications", Journal of the Electrochemical Society, vol. 149 No. 9, pp. 69-78 (2002).
Non-Final Office Action of U.S. Appl. No. 12/491,780 dated on Dec. 7, 2011.
Non-Final Office Action of U.S. Appl. No. 13/004,554 issued on Mar. 15, 2011.
Notice of Allowance of U.S. Appl. No. 11/024,722 issued on Mar. 10, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP/2007 issued on Jan. 28, 2011, corresponding to U.S. Appl. No. 12/098,263.
Non-Final Office Action of U.S. Appl. No. 12/854,001 issued on Apr. 6, 2011.
Chinese Office Action of Chinese Patent Application No. 200880105091.8 issued on Apr. 1, 2011.
Chinese Office Action of Chinese Patent Application No. 201010198537.5 issued on Mar. 18, 2011.
Chinese Office Action of Chinese Patent Application No. 201010185274.4 issued on Mar. 2, 2011.
Non-Final Office Action dated Apr. 2, 2012 issued for U.S. Appl. No. 13/279,878.
Notice of Allowance dated Apr. 11, 2012 issued for U.S. Appl. No. 12/093,441.
Final Office Action dated Apr. 18, 2012 issued for U.S. Appl. No. 12/491,457.
Final Office Action dated Apr. 26, 2012 issued for U.S. Appl. No. 12/491,780.
Non-Final Office Action of U.S. Appl. No. 12/491,457 mailed on Nov. 17, 2011.
Notice of Allowance of U.S. Appl. No. 13/004,554 mailed on Dec. 13, 2011.
Non-Final Office Action of U.S. Appl. No. 12/295,438 dated on Jan. 12, 2012.
Austrian Office Action for AT Application No. 9514/2005 issued on Jun. 1, 2011.
Austrian Office Action for AT Application No. 1545/2010-1 issued on May 31, 2011.
Final Office Action of U.S. Appl. No. 12/731,811 issued on Jul. 29, 2011.
Chinese Office Action of CN Patent Application No. 201010185246.2 dated Dec. 27, 2011 corresponding to U.S. Appl. No. 13/004,554.
Notice of Allowance dated Dec. 1, 2008 issued in U.S. Appl. No. 11/024,702.
S. Shinoya et al. (Eds.), "Principal phosphor materials and their optical properties" in Phosphor Handbook, CRC Press, 1999, p. 826.
Notice of Allowance of U.S. Appl. No. 11/948,813 issued on Aug. 22, 2011.
Notice of Allowance issued on May 9, 2014 in U.S. Appl. No. 12/097,741.

\* cited by examiner

LIGHT EMITTING DEVICE

CROSS-REFERENCE TO RELATED APPLICATIONS

This application is a continuation of U.S. patent application Ser. No. 12/491,457 (issued as U.S. pat. No. 8,318,044), filed on Jun. 25, 2009, which is a continuation-in-part of U.S. patent application Ser. No. 11/948,845, filed on Nov. 30, 2007 (issued as U.S. Pat. No. 8,066,909), which is a continuation-in-part of U.S. patent application Ser. No. 11/024,702, filed on Dec. 30, 2004 (issued as U.S. Pat. No. 7,554,129), and claims priority of Korean Patent Application No. 10-2004-0042396, filed on Jun. 10, 2004, which are all hereby incorporated by reference for all purposes as if fully set forth herein.

BACKGROUND OF THE INVENTION

1. Field of the Invention

Embodiments of the present invention relate generally to light emitting devices and, more particularly, to light emitting devices including at least one light-emitting diode and phosphor including lead- and/or copper-containing chemical compounds and converting the wavelength of light.

2. Description of the Related Art

Light emitting devices (LEDs), which used to be used for electronic devices, are now used for automobiles and illumination products. Since light emitting devices have superior electrical and mechanical characteristics, demands for light emitting devices have been increased. In connection to this, interests in white LEDs are increasing as an alternative to fluorescent lamps and incandescent lamps.

In LED technology, solution for realization of white light is proposed variously. Normally, realization of white LED technology is to put the phosphor on the light-emitting diode, and mix the primary emission from the light emitting diode and the secondary emission from the phosphor, which converts the wavelength. For example, as shown in WO 98/05078 and WO 98/12757, use a blue light emitting diode, which is capable of emitting a peak wavelength at 450-490 nm, and YAG group material, which absorbs light from the blue light emitting diode and emits yellowish light (mostly), which may have different wavelength from that of the absorbed light. However, phosphors which are used for white LEDs are usually unstable in the water, vapor or polar solvent, and this unstableness may cause changes in the emitting characteristics of white LED.

SUMMARY OF THE INVENTION

One embodiment exemplarily described herein can be generally characterized as a light emitting device that includes a light emitting diode (LED) for emitting light and a phosphor adjacent to the LED. The phosphor is excitable by light emitted by the LED and may include a first compound having a host lattice comprising first ions, silicon and oxygen. A first portion of the first ions may be substituted by divalent copper ions and the first compound may have one of an Olivin crystal structure, a β-$K_2SO_4$ crystal structure, a trigonal Glaserite ($K_3Na(SO_4)_2$) or monoclinic Merwinite crystal structure, a tetragonal Ackermanite crystal structure, a tetragonal crystal structure and an orthorhombic crystal structure.

Another embodiment exemplarily described herein can be generally characterized as a light emitting device that includes a light emitting diode (LED) for emitting light and a phosphor adjacent to the LED. The phosphor is excitable by light emitted by the LED and may include a first compound having a host lattice comprising first ions and oxygen. A first portion of the first ions may be substituted by copper ions and the copper ions do not act as luminescent ions upon excitation with the light emitted by the LED.

BRIEF DESCRIPTION OF THE DRAWINGS

Further embodiments of the invention may be apparent upon consideration of the following detailed description, taken in conjunction with the accompanying drawings, in which like reference characters refer to like parts throughout, and in which.

DETAILED DESCRIPTION

Refer to the attached drawing, the wavelength conversion light emitting device is going to be explained in detail, and the light emitting device and the phosphor are separately explained for easiness of explanation as below.

(Light Emitting Device)

Figure 1:
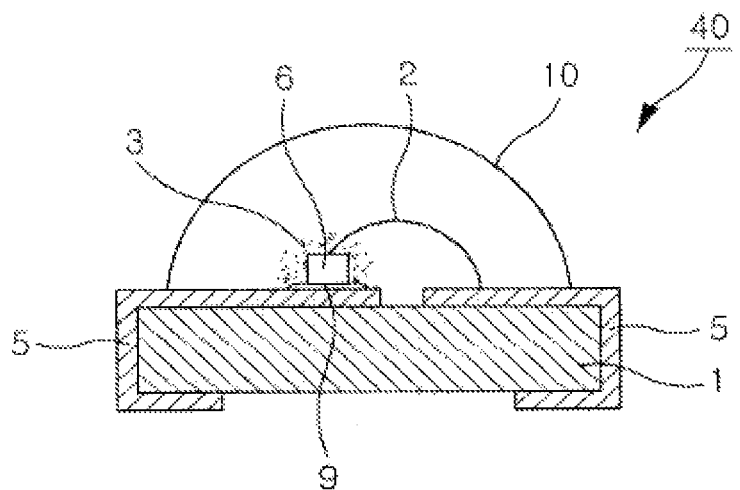
FIG. 1 shows a side cross-sectional view of an illustrative embodiment of a portion of a chip-type package light emitting device.

FIG. 1 shows a side cross-sectional view of an illustrative embodiment of a portion of a chip-type package light emitting device. The chip-type package light emitting device may comprise at least one light emitting diode and a phosphorescent substance. Electrodes 5 may be formed on both sides of substrate 1. Light emitting diode 6 emitting light may be mounted on one of the electrodes 5. Light emitting diode 6 may be mounted on electrode 5 through electrically conductive paste 9. An electrode of light emitting diode 6 may be connected to electrode pattern 5 via an electrically conductive wire 2.

Light emitting diodes may emit light with a wide range of wavelengths, for example, from ultraviolet light to visible light. In one embodiment, a UV light emitting diode and/or blue light emitting diode may be use.

Phosphor, i.e., a phosphorescent substance, 3 may be placed on the top and side faces of the light emitting diode 6. In some embodiments, the phosphor may include lead- and/or copper containing chemical compounds. In some embodiments, the chemical compounds may comprise aluminates, silicates, antimonates, germanates, germanate-silicates, phosphates, or the like, or a combination thereof. Phosphor 3 converts the wavelength of the light from the light emitting diode 6 to another wavelength or other wavelengths. In one embodiment, the light is in a visible light range after the conversion. Phosphor 3 may be applied to light emitting diode 6 after mixing phosphor 3 with a hardening resin. The hardening resin including phosphor 3 may also be applied to the bottom of light emitting diode 6 after mixing phosphor 3 with electrically conductive paste 9.

The light emitting diode 6 mounted on substrate 1 may be sealed with one or more sealing materials 10. Phosphor 3 may be placed on the top and side faces of light emitting diode 6. Phosphor 3 can also be distributed in the hardened sealing material during the production. Such a manufacturing method is described in U.S. Pat. No. 6,482,664, which is hereby incorporated by reference in its entirety.

Phosphor 3 may comprise one or more lead- and/or copper containing chemical compounds. Phosphor 3 may include one or more single chemical compounds. Each single compound may have an emission peak of, for example, from about 440 nm to about 500 nm, from about 500 nm to about 590 nm, or from about 580 nm to 700 nm Phosphor 3 may include one or more single phosphors, which may have an emission peak as exemplified above.

In regard to light emitting device 40, light emitting diode 6 may emit primary light when light emitting diode 6 receives power from a power supply. The primary light then may stimulate phosphor(s) 3, and phosphor(s) 3 may convert the primary light to a light with longer wavelength(s) (a secondary light). The primary light from the light emitting diode 6 and the secondary light from the phosphors 3 are diffused and mixed together so that a predetermined color of light in visible spectrum may be emitted from light emitting diode 6. In one embodiment, more than one light emitting diodes that have different emission peaks can be mounted together. In some embodiments, a mixture ratio of different phosphors can be adjusted to achieve a desired color of light, color temperature, and CRI.

As described above, if the light emitting diode 6 and the compound(s) included in phosphor 3 are properly controlled then the desired color temperature or specific color coordination can be provided, especially, wide range of color temperature, for example, from about 2,000K to about 8,000K or about 10,000K and/or color rendering index of greater than about 60. In some embodiments, the compound(s) included in the phosphor 3 can be controlled to have a color rendering index between about 50 and about 90. In some embodiments, the compound(s) included in the phosphor 3 can be controlled to have a color rendering index greater than about 90. In some embodiments, the compound(s) included in the phosphor 3 can be controlled to have a color rendering index between about 90 and about 95. Therefore, the light emitting devices exemplarily described herein may be used for electronic devices such as home appliances, stereos, telecommunication devices, and for interior/exterior custom displays. The light emitting devices exemplarily described herein may also be used for automobiles and illumination products because they provide similar color temperatures and CRI to those of the visible light.

Figure 2:
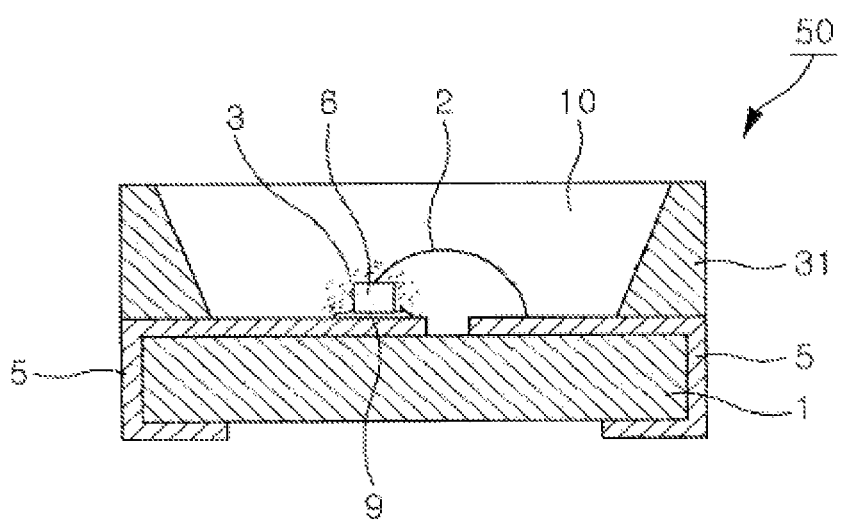
FIG. 2 shows a side cross-sectional view of an illustrative embodiment of a portion of a top-type package light emitting device.

FIG. 2 shows a side cross-sectional view of an illustrative embodiment of a portion of a top-type package light emitting device. A top-type package light emitting device may have a similar structure as that of the chip type package light emitting device 40 of FIG. 1. The top-type package device may have reflector 31 which may reflect the light from the light emitting diode 6 to the desire direction.

In top-type package light emitting device 50, more than one light emitting diodes can be mounted. Each of such light emitting diodes may have a different peak wavelength from that of others. Phosphor 3 may comprise a plurality of single compounds with different emission peaks. The proportion of each of such plurality of compounds may be regulated. Such a phosphor may be applied to the light emitting diode and/or uniformly distributed in the hardening material of the reflector 31. As explained more fully below, the phosphor may include lead- and/or copper containing aluminate type compounds, lead- and/or copper containing silicates, lead- and/or copper containing antimonates, lead- and/or copper containing germanates, lead- and/or copper containing germanate-silicates, lead and/or copper containing phosphates, or any combination thereof.

In one embodiment, the light emitting device of the FIG. 1 or FIG. 2 can include a metal substrate, which may have good heat conductivity. Such a light emitting device may easily dissipate the heat from the light emitting diode. Therefore, light emitting devices for high power may be manufactured. If a heat sink is provided beneath the metal substrate, the heat from the light emitting diode may be dissipated more effectively.

Figure 3:
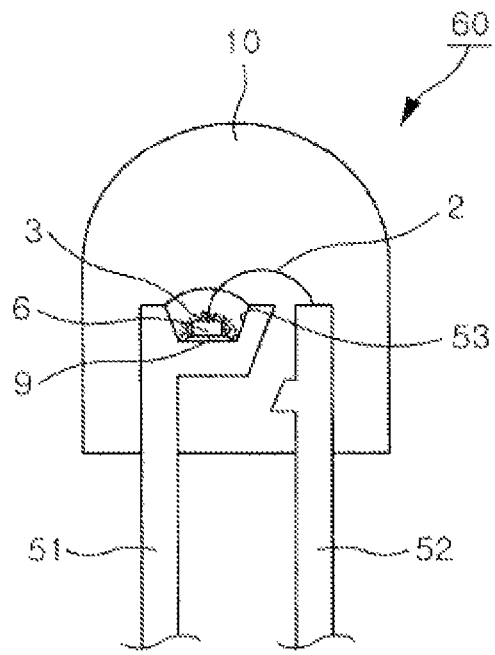
FIG. 3 shows a side cross-sectional view of an illustrative embodiment of a portion of a lamp-type package light emitting device.

FIG. 3 shows a side cross-sectional view of an illustrative embodiment of a portion of a lamp-type package light emitting device. Lamp type light emitting device 60 may have a pair of leads 51, 52, and a diode holder 53 may be formed at the end of one lead. Diode holder 53 may have a shape of cup, and one or more light emitting diodes 6 may provided in the diode holder 53. When a number of light emitting diodes are provided in the diode holder 53, each of them may have a different peak wavelength from that of others. An electrode of light emitting diode 6 may be connected to lead 52 by, for example, electrically conductive wire 2.

Regular volume of phosphor 3, which may be mixed in the epoxy resin, may be provided in diode holder 53. As explained more fully below, phosphor 3 may include lead- and/or copper containing components.

Moreover, the diode holder may include the light emitting diode 6 and the phosphor 3 may be sealed with hardening material such as epoxy resin or silicon resin.

In one embodiment, the lamp type package light emitting device may have more than one pair of electrode pair leads.

Figure 4:
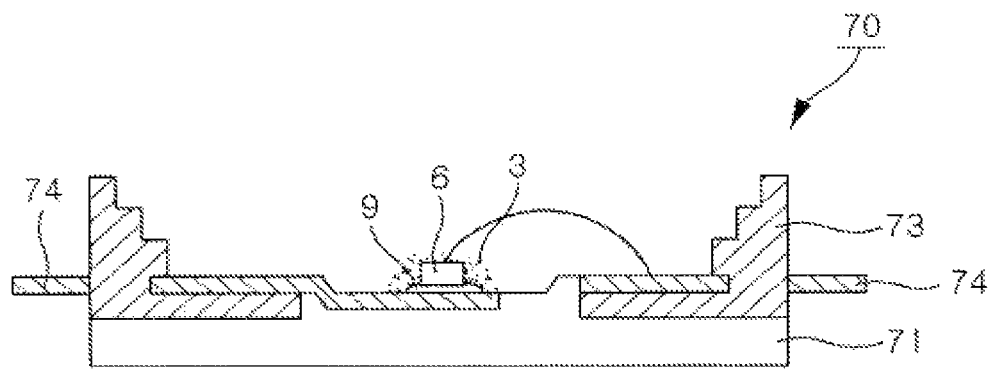
FIG. 4 shows a side cross-sectional view of an illustrative embodiment of a portion of a light emitting device for high power.

FIG. 4 shows a side cross-sectional view of an illustrative embodiment of a portion of a light emitting device for high power. Heat sink 71 may be provided inside of housing 73 of the light emitting device for high power 70, and it may be partially exposed to outside. A pair of lead frames 74 may protrude from housing 73.

One or more light emitting diodes may be mounted directly on one lead frame 74, and an electrode of the light emitting diode 6 and another lead frame 74 may be connected via electrically conductive wire. In another embodiment, one or more light emitting diodes may be mounted directly on the heat sink 71, as opposed to directly on the lead frame 74, via thermally conductive adhesive. Electrically conductive plate 9 may be provided between light emitting diode 6 and lead frame 74. The phosphor 3 may be placed on top and side faces of light emitting diode 6.

Figure 5:
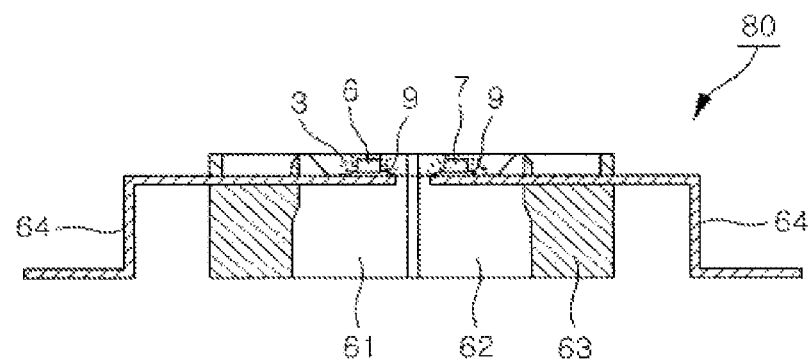
FIG. 5 shows a side cross-sectional view of another illustrative embodiment of a portion of a light emitting device for high power.

FIG. 5 shows a side cross-sectional view of another illustrative embodiment of a portion of a light emitting device for high power.

Light emitting device for high power 80 may have housing 63, which may contain light emitting diodes 6, 7, phosphor 3 arranged on the top and side faces of light emitting diodes 6, 7, one or more heat sinks 61, 62, and one or more lead frames 64. In one embodiment, one or more light emitting diodes 6, 7 may be mounted directly on one or more of the heat sinks 61, 62 via thermally conductive adhesive. In one or more of the lead frames 64. The lead frames 64 may receive power from a power supplier and may protrude from housing 63.

In the light emitting devices for high power 70, 80 in the FIGS. 4 and 5, the phosphor 3 can be added to the paste, which may be provided between heat sink and light emitting devices. A lens may be combined with housing 63, 73.

In a light emitting device for high power, one or more light emitting diodes can be used selectively and the phosphor can be regulated depending on the light emitting diode. As explained more fully below, the phosphor may include lead and/or copper containing components.

A light emitting device for high power may have a radiator (not shown) and/or heat sink(s) Air or a fan may be used to cool the radiator.

The light emitting devices exemplarily described herein are not limited to the structures described above, and the structures can be modified depending on the characteristics of light emitting diodes, phosphor, wavelength of light, and also applications. Moreover, new part can be added to the structures.

Exemplary embodiments of the phosphor 3 are described as follows.

(Phosphor)

According to some embodiments, the phosphor 3 may include one or more lead- and/or copper containing chemical compounds. The phosphor 3 may be excited by UV and/or visible (e.g., blue) light, and emit light due to transitions of the direct type, f-d transitions, or charge transfer transitions. In some embodiments, the lead- and/or copper-containing chemical compounds may be generally characterized as including a host lattice having anions and cations. In some embodiments, at least a portion of the cations are divalent cations. In some embodiments, the divalent cations include alkaline earth ions. In some embodiments, at least a portion of the divalent cations of the host lattice are substituted by divalent lead and/or divalent copper ions.

As mentioned above, conventional luminescent materials and phosphors are generally unstable in water, air humidity, water steam and polar solvents. However, due to a higher covalency and a lower basicity, the substitutionally-incorporated divalent lead and/or divalent copper ions in the host lattice of the chemical compound yields luminescent materials have improved resistance against water, air humidity and polar solvents. Moreover, it will be appreciated that the divalent lead and/or divalent copper ions within the host lattice do not act as activators (also referred to herein as "luminescent center ions") and, therefore do not luminesce.

As described above, the phosphor 3 may include one or more chemical compounds such as, for example, aluminates, silicates, antimonates, germanates, germanate-silicates, and/or phosphates. Exemplary embodiments of these chemical compounds are described in greater detail below.

In some embodiments, the lead- and/or copper-containing aluminates may be generally characterized according to formulas (1), (2), and (5)

$$a(M'O).b(M''_2O).c(M''X).d(Al_2O_3).e(M'''O).f(M''''_2O_3).g(M'''''_oO_p).h(M''''''_xO_y)$$ (1)

wherein M' may be Pb, Cu, and/or any combination thereof; M'' may be one or more monovalent elements, for example, Li, Na, K, Rb, Cs, Au, Ag, and/or any combination thereof; M''' may be one or more divalent elements, for example, Be, Mg, Ca, Sr, Ba, Zn, Cd, Mn, and/or any combination thereof; M'''' may be one or more trivalent elements, for example, Sc, B, Ga, In, and/or any combination thereof; M''''' may be Si, Ge, Ti, Zr, Mn, V, Nb, Ta, W, Mo, and/or any combination thereof; M'''''' may be Bi, Sn, Sb, Sc, Y, La, Ce, Pr, Nd, Pm, Sm, Eu, Gd, Tb, Dy, Ho, Er, Tm, Yb, Lu, and/or any combination thereof, X may be F, Cl, Br, I, and/or any combination thereof; $0<a\leq 2$; $0\leq b\leq 2$; $0\leq c\leq 2$; $0<d\leq 8$; $0<e\leq 4$; $0\leq f\leq 3$; $0\leq g\leq 8$; $0<h\leq 2$; $1\leq o\leq 2$; $1\leq p\leq 5$; $1\leq x\leq 2$; and $1\leq y\leq 5$.

$$a(M'O)b(M''_2O)c(M''X)4-a-b-c(M'''O)7(Al_2O_3)d \\ (B_2O_3)e(Ga_2O_3)f(SiO_2)g(GeO_2)h(M''''_xO_y)$$ (2)

wherein M' may be Pb, Cu, and/or any combination thereof; M'' may be one or more monovalent elements, for example, Li, Na, K, Rb, Cs, Au, Ag, and/or any combination thereof; M''' may be one or more divalent elements, for example, Be, Mg, Ca, Sr, Ba, Zn, Cd, Mn, and/or any combination thereof; M'''' may be Bi, Sn, Sb, Sc, Y, La, In, Ce, Pr, Nd, Pm, Sm, Eu, Gd, Tb, Dy, Ho, Er, Tm, Yb, Lu, and any combination thereof, X may be F, Cl, Br, I, and any combination thereof; $0<a\leq 4$; $0\leq b\leq 2$; $0\leq c\leq 2$; $0\leq d\leq 1$; $0\leq e\leq 1$; $0\leq f\leq 1$; $0\leq g\leq 1$; $0<h\leq 2$; $1\leq x\leq 2$; and $1\leq y\leq 5$.

The preparation of copper- as well as lead containing luminescent materials may be a basic solid state reaction. Pure starting materials without any impurities, e.g. iron, may be used.

Any starting material which may transfer into oxides via a heating process may be used to form oxygen dominated phosphors.

EXAMPLES OF PREPARATION

Preparation of the Luminescent Material Having Formula (3)

$$Cu_{0.02}Sr_{3.98}Al_{14}O_{25}: Eu$$ (3)

Starting materials: CuO, SrCO$_3$, Al(OH)$_3$, Eu$_2$O$_3$, and/or any combination thereof.

The starting materials in the form of oxides, hydroxides, and/or carbonates may be mixed in stoichiometric proportions together with small amounts of flux, e.g., H$_3$BO$_3$. The mixture may be fired in an alumina crucible in a first step at about 1,200° C. for about one hour. After milling the pre-fired materials a second firing step at about 1,450° C. in a reduced atmosphere for about 4 hours may be followed. After that the material may be milled, washed, dried and sieved. The resulting luminescent material may have an emission maximum of about 494 nm

TABLE 1 copper-containing Eu$^{2+}$-activated aluminate compared with Eu$^{2+}$-activated aluminate without copper at about 400 nm excitation wavelength

| | Copper doped compound Cu$_{0.02}$Sr$_{3.98}$Al$_{14}$O$_{25}$: Eu | Compound without copper Sr$_4$Al$_{14}$O$_{25}$: Eu |
|---|---|---|
| Luminous density (%) | 103.1 | 100 |
| Wavelength (nm) | 494 | 493 |

Preparation of the Luminescent Material Having Formula (4)

$$Pb_{0.05}Sr_{3.95}Al_{14}O_{25}: Eu$$ (4)

Starting materials: PbO, SrCO$_3$, Al$_2$O$_3$, Eu$_2$O$_3$, and/or any combination thereof.

The starting materials in form of very pure oxides, carbonates, or other components which may decompose thermally into oxides, may be mixed in stoichiometric proportion together with small amounts of flux, for example, H$_3$BO$_3$. The mixture may be fired in an alumina crucible at about 1,200° C. for about one hour in the air. After milling the pre-fired materials a second firing step at about 1,450° C. in air for about 2 hours and in a reduced atmosphere for about 2 hours may be followed. Then the material may be milled, washed, dried, and sieved. The resulting luminescent material may have an emission maximum of from about 494.5 nm

TABLE 2 lead-containing $Eu^{2+}$-activated aluminate compared with $Eu^{2+}$-activated aluminate without lead at about 400 nm excitation wavelength

|  | Lead-containing compound $Pb_{0.05}Sr_{3.95}Al_{14}O_{25}$: Eu | Compound without lead $Sr_4Al_{14}O_{25}$: Eu |
|---|---|---|
| Luminous density (%) | 101.4 | 100 |
| Wavelength (nm) | 494.5 | 493 |

TABLE 3 optical properties of some copper- and/or lead doped aluminates excitable by long wave ultraviolet and/or by visible light and their luminous density in % at 400 nm excitation wavelength

| Composition | Possible excitation range (nm) | Luminous density at 400 nm excitation compared with compounds not containing copper/lead (%) | Peak wave length of lead-/copper- contaning materials (nm) | Peak wave length of materials without lead/copper (nm) |
|---|---|---|---|---|
| $Cu_{0.5}Sr_{3.5}Al_{14}O_{25}$: Eu | 360-430 | 101.2 | 495 | 493 |
| $Cu_{0.02}Sr_{3.98}Al_{14}O_{25}$: Eu | 360-430 | 103.1 | 494 | 493 |
| $Pb_{0.05}Sr_{3.95}Al_{14}O_{25}$: Eu | 360-430 | 101.4 | 494.5 | 493 |
| $Cu_{0.01}Sr_{3.99}Al_{13.995}Si_{0.005}O_{25}$: Eu | 360-430 | 103 | 494 | 492 |
| $Cu_{0.01}Sr_{3.395}Ba_{0.595}Al_{14}O_{25}$: Eu, Dy | 360-430 | 100.8 | 494 | 493 |
| $Pb_{0.05}Sr_{3.95}Al_{13.95}Ga_{0.05}O_{25}$: Eu | 360-430 | 101.5 | 494 | 494 |

$$a(M'O).b(M''O).c(Al_2O_3).d(M'''_2O_3).e(M''''O_2).f(M'''''_xO_y) \quad (5)$$

wherein M' may be Pb, Cu, and/or any combination thereof; M" may be Be, Mg, Ca, Sr, Ba, Zn, Cd, Mn, and/or any combination thereof; M'" may be B, Ga, In, and/or any combination thereof; M"" may be Si, Ge, Ti, Zr, Hf, and/or any combination thereof; M""' may be Bi, Sn, Sb, Sc, Y, La, Ce, Pr, Nd, Pm, Sm, Eu, Gd, Tb, Dy, Ho, Er, Tm, Yb, Lu, and/or any combination thereof; $0 < a \leq 1$; $0 \leq b \leq 2$; $0 < c \leq 8$; $0 \leq d \leq 1$; $0 \leq e \leq 1$; $0 < f \leq 2$; $1 \leq x \leq 2$; and $1 \leq y \leq 5$.

EXAMPLE OF PREPARATION

Preparation of the Luminescent Material Having Formula (6)

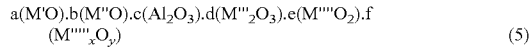
$$Cu_{0.05}Sr_{0.95}Al_{1.9997}Si_{0.0003}O_4: Eu \quad (6)$$

Starting materials: CuO, SrCO$_3$, Al$_2$O$_3$, SiO$_2$, Eu$_2$O$_3$, and/or any combination thereof.

The starting materials in the form of, for example, pure oxides and/or as carbonates may be mixed in stoichiometric proportions together with small amounts of flux, for example, AlF$_3$. The mixture may be fired in an alumina crucible at about 1,250° C. in a reduced atmosphere for about 3 hours. After that the material may be milled, washed, dried and sieved. The resulting luminescent material may have an emission maximum of about 521.5 nm

TABLE 4 copper-containing $Eu^{2+}$-activated aluminate compared with $Eu^{2+}$-activated aluminate without copper at about 400 nm excitation wavelength

|  | Copper-containing compound $Cu_{0.05}Sr_{0.95}Al_{1.9997}Si_{0.0003}O_4$: Eu | Compound without copper $SrAl_2O_4$: Eu |
|---|---|---|
| Luminous density (%) | 106 | 100 |
| Wavelength (nm) | 521.5 | 519 |

Preparation of the Luminescent Material Having Formula (7)

$$Cu_{0.12}BaMg_{1.88}Al_{16}O_{27}: Eu \quad (7)$$

Starting materials: CuO, MgO, BaCO$_3$, Al(OH)$_3$, Eu$_2$O$_3$, and/or any combination thereof.

The starting materials in the form of, for example, pure oxides, hydroxides, and/or carbonates may be mixed in stoichiometric proportions together with small amounts of flux, for example, AlF$_3$. The mixture may be fired in an alumina crucible at about 1,420° C. in a reduced atmosphere for about 2 hours. After that the material may be milled, washed, dried, and sieved. The resulting luminescent material may have an emission maximum of about 452 nm

TABLE 5 copper-containing $Eu^{2+}$-activated aluminate compared with copper not doped $Eu^{2+}$-activated aluminate at 400 nm excitation wavelength

|  | Copper-containing compound $Cu_{0.12}BaMg_{1.88}Al_{16}O_{27}$: Eu | Comparison without copper $BaMg_2Al_{16}O_{27}$: Eu |
|---|---|---|
| Luminous density (%) | 101 | 100 |
| Wavelength (nm) | 452 | 450 |

Preparation of the Luminescent Material Having Formula (8)

$$Pb_{0.1}Sr_{0.9}Al_2O_4: Eu \quad (8)$$

Starting materials: PbO, SrCO$_3$, Al(OH)$_3$, Eu$_2$O$_3$, and/or any combination thereof.

The starting materials in form of, for example, pure oxides, hydroxides, and/or carbonates may be mixed in stoichiometric proportions together with small amounts of flux, for example, H$_3$BO$_3$. The mixture may be fired in an alumina crucible at about 1,000° C. for about 2 hours in the air. After milling the pre-fired materials a second firing step at about 1,420° C. in the air for about 1 hour and in a reduced atmosphere for about 2 hours may be followed. After that the material may be milled, washed, dried and sieved. The resulting luminescent material may have an emission maximum of about 521 nm

TABLE 6 lead-containing $Eu^{2+}$-activated aluminate compared with $Eu^{2+}$-activated aluminate without lead at about 400 nm excitation wavelength

|  | Lead-containing compound $Pb_{0.1}Sr_{0.9}Al_2O_4$: Eu | Compound without lead $SrAl_2O_4$: Eu |
|---|---|---|
| Luminous density (%) | 102 | 100 |
| Wavelength (nm) | 521 | 519 |

Results obtained in regard to copper- and/or lead doped aluminates are shown in table 7.

TABLE 7 optical properties of some copper- and/or lead doped aluminates excitable by long wave ultraviolet and/or by visible light and their luminous density in % at 400 nm excitation wavelength

| Composition | Possible excitation range (nm) | Luminous density at 400 nm excitation compared with compounds not containing copper/lead (%) | Peak wave length of lead-/copper- containing materials (nm) | Peak wave length of materials without lead/copper (nm) |
|---|---|---|---|---|
| $Cu_{0.05}Sr_{0.95}Al_{1.9997}Si_{0.0003}O_4$: Eu | 360-440 | 106 | 521.5 | 519 |
| $Cu_{0.2}Mg_{0.7995}Li_{0.0005}Al_{1.9}Ga_{0.1}O_4$: Eu, Dy | 360-440 | 101.2 | 482 | 480 |
| $Pb_{0.1}Sr_{0.9}Al_2O_4$: Eu | 360-440 | 102 | 521 | 519 |
| $Cu_{0.05}BaMg_{1.95}Al_{16}O_{27}$: Eu, Mn | 360-400 | 100.5 | 451, 515 | 450, 515 |
| $Cu_{0.12}BaMg_{1.88}Al_{16}O_{27}$: Eu | 360-400 | 101 | 452 | 450 |
| $Cu_{0.01}BaMg_{0.99}Al_{10}O_{17}$: Eu | 360-400 | 102.5 | 451 | 449 |
| $Pb_{0.1}BaMg_{0.9}Al_{9.5}Ga_{0.5}O_{17}$: Eu, Dy | 360-400 | 100.8 | 448 | 450 |
| $Pb_{0.08}Sr_{0.902}Al_2O_4$: Eu, Dy | 360-440 | 102.4 | 521 | 519 |
| $Pb_{0.2}Sr_{0.8}Al_2O_4$: Mn | 360-440 | 100.8 | 658 | 655 |
| $Cu_{0.06}Sr_{0.94}Al_2O_4$: Eu | 360-440 | 102.3 | 521 | 519 |
| $Cu_{0.05}Ba_{0.94}Pb_{0.06}Mg_{0.95}Al_{10}O_{17}$: Eu | 360-440 | 100.4 | 451 | 449 |
| $Pb_{0.3}Ba_{0.7}Cu_{0.1}Mg_{1.9}Al_{16}O_{27}$: Eu | 360-400 | 100.8 | 452 | 450 |
| $Pb_{0.3}Ba_{0.7}Cu_{0.1}Mg_{1.9}Al_{16}O_{27}$: Eu, Mn | 360-400 | 100.4 | 452, 515 | 450, 515 |

In some embodiments, the lead- and/or copper-containing silicates may be generally characterized according to formula (9)

$$a(M'O).b(M''O).c(M'''X).d(M'''_2O).e(M''''_2O_3).f(M'''''_oO_p).g(SiO_2).h(M''''''_xO_y) \quad (9)$$

wherein M' may be Pb, Cu, and/or any combination thereof; M'' may be Be, Mg, Ca, Sr, Ba, Zn, Cd, Mn, and/or any combination thereof; M''' may be Li, Na, K, Rb, Cs, Au, Ag, and/or any combination thereof; M'''' may be Al, Ga, In, and/or any combination thereof; M''''' may be Ge, V, Nb, Ta, W, Mo, Ti, Zr, Hf, and/or any combination thereof; M'''''' may be Bi, Sn, Sb, Sc, Y, La, Ce, Pr, Nd, Pm, Sm, Eu, Gd, Tb, Dy, Ho, Er, Tm, Yb, Lu, and/or any combination thereof; X may be F, Cl, Br, I, and any combination thereof; 0<a≤2; 0<b≤8; 0≤c≤4; 0≤d≤2; 0≤e≤2; 0≤f≤2; 0<g≤10; 0<h≤5; 1≤o≤2; 1≤p≤5; 1≤x≤2; and 1≤y≤5.

The copper-containing silicates exemplarily described herein may, in some embodiments, contain $SiO_4$ and can be characterized as having an Olivin structure (orthorhombic) or β-$K_2SO_4$ structure (orthorhombic); contain $Si_2O_8$ and be characterized as having a trigonal Glaserite ($K_3Na(SO_4)_2$) or monoclinic Merwinite structure; contain $Si_2O_7$ and be characterized as having a tetragonal Ackermanite structure; contain $SiO_5$ and be characterized as having a tetragonal structure; and/or contain $Si_2O_5$ and be characterized as having an orthorhombic structure.

EXAMPLE OF PREPARATION

Preparation of the Luminescent Material Having Formula (10)

$$Cu_{0.05}Sr_{1.7}Ca_{0.25}SiO_4: Eu \quad (10)$$

Starting materials: CuO, $SrCO_3$, $CaCO_3$, $SiO_2$, $Eu_2O_3$, and/or any combination thereof.

The starting materials in the form of pure oxides and/or carbonates may be mixed in stoichiometric proportions together with small amounts of flux, for example $NH_4Cl$. The mixture may be fired in an alumina crucible at about 1,200° C. in an inert gas atmosphere (e.g., $N_2$ or noble gas) for about 2 hours. Then the material may be milled. After that, the material may be fired in an alumina crucible at about 1,200° C. in a slightly reduced atmosphere for about 2 hours. Then, the material may be milled, washed, dried, and sieved. The resulting luminescent material may have an emission maximum at about 592 nm

TABLE 8 copper-containing $Eu^{2+}$-activated silicate compared with $Eu^{2+}$-activated silicate without copper at about 400 nm excitation wavelength

|  | Copper-containing compound $Cu_{0.05}Sr_{1.17}Ca_{0.25}SiO_4$: Eu | Compound without copper $Sr_{1.7}Ca_{0.3}SiO_4$: Eu |
|---|---|---|
| Luminous density (%) | 104 | 100 |
| Wavelength (nm) | 592 | 588 |

Preparation of the Luminescent Material Having Formula (11):

$$Cu_{0.2}Ba_2Zn_{0.2}Mg_{0.6}Si_2O_7: Eu \quad (11)$$

Starting materials: CuO, BaCO$_3$, ZnO, MgO, SiO$_2$, Eu$_2$O$_3$, and/or any combination thereof.

The starting materials in the form of very pure oxides and carbonates may be mixed in stoichiometric proportions together with small amounts of flux, for example, NH$_4$Cl. In a first step the mixture may be fired in an alumina crucible at about 1,100° C. in a reduced atmosphere for about 2 hours. Then the material may be milled. After that the material may be fired in an alumina crucible at about 1,235° C. in a reduced atmosphere for about 2 hours. Then that the material may be milled, washed, dried and sieved. The resulting luminescent material may have an emission maximum at about 467 nm.

TABLE 9 copper-containing Eu$^{2+}$-activated silicate compared with Eu$^{2+}$-activated silicate without copper at 400 nm excitation wavelength

|  | Copper-containing compound Cu$_{0.2}$Sr$_2$Zn$_{0.2}$Mg$_{0.6}$Si$_2$O$_7$: Eu | Compound without copper Sr$_2$Zn$_{0.2}$Mg$_{0.6}$Si$_2$O$_7$: Eu |
|---|---|---|
| Luminous density (%) | 101.5 | 100 |
| Wavelength (nm) | 467 | 465 |

Preparation of the Luminescent Material Having Formula (12)

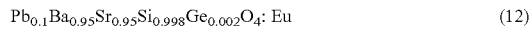

Pb$_{0.1}$Ba$_{0.95}$Sr$_{0.95}$Si$_{0.998}$Ge$_{0.002}$O$_4$: Eu        (12)

Starting materials: PbO, SrCO$_3$, BaCO$_3$, SiO$_2$, GeO$_2$, Eu$_2$O$_3$, and/or any combination thereof.

The starting materials in the form of oxides and/or carbonates may be mixed in stoichiometric proportions together with small amounts of flux, for example, NH$_4$Cl. The mixture may be fired in an alumina crucible at about 1,000° C. for about 2 hours in the air. After milling the pre-fired materials a second firing step at 1,220° C. in air for 4 hours and in reducing atmosphere for 2 hours may be followed. After that the material may be milled, washed, dried and sieved. The resulting luminescent material may have an emission maximum at about 527 nm.

TABLE 10 lead-containing Eu$^{2+}$-activated silicate compared with Eu$^{2+}$-activated silicate without lead at about 400 nm excitation wavelength

|  | Lead-containing compound Pb$_{0.1}$Ba$_{0.95}$Sr$_{0.95}$Si$_{0.998}$Ge$_{0.002}$O$_4$: Eu | Compound without lead BaSrSiO$_4$: Eu |
|---|---|---|
| Luminous density (%) | 101.3 | 100 |
| Wavelength (nm) | 527 | 525 |

Preparation of the Luminescent Material Having Formula (13)

Pb$_{0.25}$Sr$_{3.75}$Si$_3$O$_8$Cl$_4$: Eu        (13)

Starting materials: PbO, SrCO$_3$, SrCl$_2$ SiO$_2$, Eu$_2$O$_3$, and any combination thereof.

The starting materials in the form of oxides, chlorides, and/or carbonates may be mixed in stoichiometric proportions together with small amounts of flux, for example, NH$_4$Cl. The mixture may be fired in an alumina crucible in a first step at about 1,100° C. for about 2 hours in the air. After milling the pre-fired materials a second firing step at about 1,220° C. in the air for about 4 hours and in a reduced atmosphere for about 1 hour may be followed. After that the material may be milled, washed, dried and sieved. The resulting luminescent material may have an emission maximum at about 492 nm

TABLE 11 lead-containing Eu$^{2+}$-activated chlorosilicate compared with Eu$^{2+}$-activated chlorosilicate without lead at 400 nm excitation wavelength

|  | Lead-containing compound Pb$_{0.25}$Sr$_{3.75}$Si$_3$O$_8$Cl$_4$: Eu | Compound without lead Sr$_4$Si$_3$O$_8$Cl$_4$: Eu |
|---|---|---|
| Luminous density (%) | 100.6 | 100 |
| Wavelength (nm) | 492 | 490 |

Results obtained with respect to copper- and/or lead-containing silicates are shown in table 12.

TABLE 12 optical properties of some copper- and/or lead-containing rare earth activated silicates excitable by long wave ultraviolet and/or by visible light and their luminous density in % at about 400 nm excitation wavelength

| Composition | Possible excitation range (nm) | Luminous density at 400 nm excitation compared with compounds not containing copper/lead (%) | Peak wave length of lead-/copper- doped materials (nm) | Peak wave length of materials without lead/copper (nm) |
|---|---|---|---|---|
| Pb$_{0.1}$Ba$_{0.95}$Sr$_{0.95}$Si$_{0.998}$Ge$_{0.002}$O$_4$: Eu | 360-470 | 101.3 | 527 | 525 |
| Cu$_{0.02}$(Ba,Sr,Ca,Zn)$_{1.98}$SiO$_4$: Eu | 360-500 | 108.2 | 565 | 560 |
| Cu$_{0.05}$Sr$_{1.7}$Ca$_{0.25}$SiO$_4$: Eu | 360-470 | 104 | 592 | 588 |
| Cu$_{0.05}$Li$_{0.002}$Sr$_{1.5}$Ba$_{0.448}$SiO$_4$: Gd, Eu | 360-470 | 102.5 | 557 | 555 |
| Cu$_{0.2}$Sr$_2$Zn$_{0.2}$Mg$_{0.6}$Si$_2$O$_7$: Eu | 360-450 | 101.5 | 467 | 465 |
| Cu$_{0.02}$Ba$_{2.8}$Sr$_{0.2}$Mg$_{0.98}$Si$_2$O$_8$: Eu, Mn | 360-420 | 100.8 | 440, 660 | 438, 660 |
| Pb$_{0.25}$Sr$_{3.75}$Si$_3$O$_8$Cl$_4$: Eu | 360-470 | 100.6 | 492 | 490 |
| Cu$_{0.2}$Ba$_{2.2}$Sr$_{0.75}$Pb$_{0.05}$Zn$_{0.8}$Si$_2$O$_8$: Eu | 360-430 | 100.8 | 448 | 445 |
| Cu$_{0.2}$Ba$_3$Mg$_{0.8}$Si$_{1.99}$Ge$_{0.01}$O$_8$: Eu | 360-430 | 101 | 444 | 440 |
| Cu$_{0.5}$Zn$_{0.5}$Ba$_2$Ge$_{0.2}$Si$_{1.8}$O$_7$: Eu | 360-420 | 102.5 | 435 | 433 |
| Cu$_{0.8}$Mg$_{0.2}$Ba$_3$Si$_2$O$_8$: Eu, Mn | 360-430 | 103 | 438, 670 | 435, 670 |
| Pb$_{0.15}$Ba$_{1.84}$Zn$_{0.01}$Si$_{0.99}$Zr$_{0.01}$O$_4$: Eu | 360-500 | 101 | 512 | 510 |
| Cu$_{0.2}$Ba$_5$Ca$_{2.8}$Si$_4$O$_{16}$: Eu | 360-470 | 101.8 | 495 | 491 |

In some embodiments, the lead- and/or copper-containing antimonates may be generally characterized according to formula (14)

$$a(M'O).b(M''_2O).c(M''X).d(Sb_2O_5).e(M'''O).f(M''''_xO_y) \quad (14)$$

wherein M' may be Pb, Cu, and/or any combination thereof; M'' may be Li, Na, K, Rb, Cs, Au, Ag, and/or any combination thereof; M''' may be Be, Mg, Ca, Sr, Ba, Zn, Cd, Mn, and/or any combination thereof; M'''' may be Bi, Sn, Sc, Y, La, Pr, Sm, Eu, Tb, Dy, Gd, and/or any combination thereof; X may be F, Cl, Br, I, and/or any combination thereof; $0<a\leq2$; $0\leq b\leq2$; $0\leq c\leq4$; $0<d\leq8$; $0\leq e\leq8$; $0\leq f\leq2$; $1\leq x\leq2$; and $1\leq y\leq5$.

EXAMPLES OF PREPARATION

Preparation of the Luminescent Material Having Formula (15)

$$Cu_{0.2}Mg_{1.7}Li_{0.2}Sb_2O_7: Mn \quad (15)$$

Starting materials: CuO, MgO, Li$_2$O, Sb$_2$O$_5$, MnCO$_3$, and/or any combination thereof.

The starting materials in the form of oxides may be mixed in stoichiometric proportion together with small amounts of flux. In a first step the mixture may be fired in an alumina crucible at about 985° C. in the air for about 2 hours. After pre-firing the material may be milled again. In a second step the mixture may be fired in an alumina crucible at about 1,200° C. in an atmosphere containing oxygen for about 8 hours. After that the material may be milled, washed, dried and sieved. The resulting luminescent material may have an emission maximum at about 626 nm

TABLE 13 copper-containing antimonate compared with antimonate without copper at about 400 nm excitation wavelength

|  | Copper-containing compound $Cu_{0.2}Mg_{1.7}Li_{0.2}Sb_2O_7$: Mn | Comparison without copper $Mg_2Li_{0.2}Sb_2O_7$: Mn |
|---|---|---|
| Luminous density (%) | 101.8 | 100 |

TABLE 13-continued copper-containing antimonate compared with antimonate without copper at about 400 nm excitation wavelength

|  | Copper-containing compound $Cu_{0.2}Mg_{1.7}Li_{0.2}Sb_2O_7$: Mn | Comparison without copper $Mg_2Li_{0.2}Sb_2O_7$: Mn |
|---|---|---|
| Wavelength (nm) | 652 | 650 |

Preparation of the Luminescent Material Having Formula (16)

$$Pb_{0.006}Ca_{0.6}Sr_{0.394}Sb_2O_6 \quad (16)$$

Starting materials: PbO, CaCO$_3$, SrCO$_3$, Sb$_2$O$_5$, and/or any combination thereof.

The starting materials in the form of oxides and/or carbonates may be mixed in stoichiometric proportions together with small amounts of flux. In a first step the mixture may be fired in an alumina crucible at about 975° C. in the air for about 2 hours. After pre-firing the material may be milled again. In a second step the mixture may be fired in an alumina crucible at about 1,175° C. in the air for about 4 hours and then in an oxygen-containing atmosphere for about 4 hours. After that the material may be milled, washed, dried and sieved. The resulting luminescent material may have an emission maximum at about 637 nm

TABLE 14 lead-containing antimonate compared with antimonate without lead at 400 nm excitation wavelength

|  | Lead-containing compound $Pb_{0.006}Ca_{0.6}Sr_{0.394}Sb_2O_6$ | Compound without lead $Ca_{0.6}Sr_{0.4}Sb_2O_6$ |
|---|---|---|
| Luminous density (%) | 102 | 100 |
| Wavelength (nm) | 637 | 638 |

Results obtained in respect to copper- and/or lead-containing antimonates are shown in table 15.

TABLE 15 optical properties of some copper- and/or lead-containing antimonates excitable by long wave ultraviolet and/or by visible light and their luminous density in % at about 400 nm excitation wavelength

| Composition | Possible excitation range (nm) | Luminous density at 400 nm excitation compared compounds not containing copper/lead (%) | Peak wave length of lead-/copper-doped materials (nm) | Peak wave length of materials without lead/copper (nm) |
|---|---|---|---|---|
| $Pb_{0.2}Mg_{0.002}Ca_{1.798}Sb_2O_6F_2$: Mn | 360-400 | 102 | 645 | 649 |
| $Cu_{0.15}Ca_{1.845}Sr_{0.005}Sb_{1.998}Si_{0.002}O_7$: Mn | 360-400 | 101.5 | 660 | 658 |
| $Cu_{0.2}Mg_{1.7}Li_{0.2}Sb_2O_7$: Mn | 360-400 | 101.8 | 652 | 650 |
| $Cu_{0.2}Pb_{0.01}Ca_{0.79}Sb_{1.98}Nb_{0.02}O_6$: Mn | 360-400 | 98.5 | 658 | 658 |
| $Cu_{0.01}Ca_{1.99}Sb_{1.9995}V_{0.0005}O_7$: Mn | 360-400 | 100.5 | 660 | 657 |
| $Pb_{0.006}Ca_{0.6}Sr_{0.394}Sb_2O_6$ | 360-400 | 102 | 637 | 638 |
| $Cu_{0.02}Ca_{0.9}Sr_{0.5}Ba_{0.4}Mg_{0.18}Sb_2O_7$ | 360-400 | 102.5 | 649 | 645 |
| $Pb_{0.198}Mg_{0.004}Ca_{1.798}Sb_2O_6F_2$ | 360-400 | 101.8 | 628 | 630 |

In some embodiments, the lead- and/or copper-containing germanates and/or germanate-silicates may be generally characterized according to formula (17)

$$a(M'O).b(M''_2O)c(M''X).d(GeO_2).e(M'''O).\\f(M''''_2O_3).g(M''''_oO_p).h(M''''''_xO_y) \quad (17)$$

wherein M' may be Pb, Cu, and/or any combination thereof; M'' may be Li, Na, K, Rb, Cs, Au, Ag, and/or any combination thereof; M''' may be Be, Mg, Ca, Sr, Ba, Zn, Cd, and/or any combination thereof; M'''' may be Sc, Y, B, Al, La, Ga, In, and/or any combination thereof; M''''' may be Si, Ti, Zr, Mn, V, Nb, Ta, W, Mo, and/or any combination thereof; M'''''' may be Bi, Sn, Pr, Sm, Eu, Gd, Dy, and/or any combination thereof X may be F, Cl, Br, I, and/or any combination thereof $0<a\leq2$; $0\leq b\leq2$; $0\leq c\leq10$; $0<d\leq10$; $0\leq e\leq14$; $0\leq f\leq14$; $0\leq g\leq10$; $0\leq h\leq2$; $1\leq o\leq2$; $1\leq p\leq5$; $1\leq x\leq2$; and $1\leq y\leq5$.

EXAMPLE OF PREPARATION

Preparation of the Luminescent Material Having Formula (18)

$$Pb_{0.004}Ca_{1.99}Zn_{0.006}Ge_{0.8}Si_{0.2}O_4: Mn \quad (18)$$

Starting materials: PbO, CaCO$_3$, ZnO, GeO$_2$, SiO$_2$, MnCO$_3$, and/or any combination thereof, The starting materials in the form of oxides and/or carbonates may be mixed in stoichiometric proportions together with small amounts of flux, for example, NH$_4$Cl. In a first step the mixture may be fired in an alumina crucible at about 1,200° C. in an oxygen-containing atmosphere for about 2 hours. Then, the material may be milled again. In a second step the mixture may be fired in an alumina crucible at about 1,200° C. in oxygen containing atmosphere for about 2 hours. After that the material may be milled, washed, dried and sieved. The resulting luminescent material may have an emission maximum at about 655 nm.

TABLE 16 lead-containing Mn-activated germanate compared with Mn-activated germanate without lead at about 400 nm excitation wavelength

| | Copper-containing compound Pb$_{0.004}$Ca$_{1.99}$Zn$_{0.006}$Ge$_{0.8}$Si$_{0.2}$O$_4$: Mn | Comparison without copper Ca$_{1.99}$Zn$_{0.01}$Ge$_{0.8}$Si$_{0.2}$O$_4$: Mn |
|---|---|---|
| Luminous density (%) | 101.5 | 100 |

TABLE 16-continued lead-containing Mn-activated germanate compared with Mn-activated germanate without lead at about 400 nm excitation wavelength

| | Copper-containing compound Pb$_{0.004}$Ca$_{1.99}$Zn$_{0.006}$Ge$_{0.8}$Si$_{0.2}$O$_4$: Mn | Comparison without copper Ca$_{1.99}$Zn$_{0.01}$Ge$_{0.8}$Si$_{0.2}$O$_4$: Mn |
|---|---|---|
| Wavelength (nm) | 655 | 657 |

Preparation of the Luminescent Material Having Formula (19)

$$Cu_{0.46}Sr_{0.54}Ge_{0.6}Si_{0.4}O_3: Mn \quad (19)$$

Starting materials: CuO, SrCO$_3$, GeO$_2$, SiO$_2$, MnCO$_3$, and/or any combination thereof.

The starting materials in the form of oxides and/or carbonates may be mixed in stoichiometric proportions together with small amounts of flux, for example, NH$_4$Cl. In a first step the mixture may be fired in an alumina crucible at about 1,100° C. in an oxygen-containing atmosphere for about 2 hours. Then, the material may be milled again. In a second step the mixture may be fired in an alumina crucible at about 1,180° C. in an oxygen-containing atmosphere for about 4 hours. After that the material may be milled, washed, dried and sieved. The resulting luminescent material may have an emission maximum at about 658 nm.

TABLE 17 copper-containing Mn-activated germanate-silicate compared with Mn-activated germanate-silicate without copper at 400 nm excitation wavelength

| | Copper-containing compound Cu$_{0.46}$Sr$_{0.54}$Ge$_{0.6}$Si$_{0.4}$O$_3$: Mn | Compound without copper SrGe$_{0.6}$Si$_{0.4}$O$_3$: Mn |
|---|---|---|
| Luminous density (%) | 103 | 100 |
| Wavelength (nm) | 658 | 655 |

TABLE 18 optical properties of some copper- and/or lead-doped germanate-silicates excitable by long wave ultraviolet and/or by visible light and their luminous density in % at about 400 nm excitation wavelength

| Composition | Possible excitation range (nm) | Luminous density at 400 nm excitation compared with compounds not containing copper/lead (%) | Peak wave length of lead-/copper-doped materials (nm) | Peak wave length of materials without lead/copper (nm) |
|---|---|---|---|---|
| Pb$_{0.004}$Ca$_{1.99}$Zn$_{0.006}$Ge$_{0.8}$Si$_{0.2}$O$_4$: Mn | 360-400 | 101.5 | 655 | 657 |
| Pb$_{0.002}$Sr$_{0.954}$Ca$_{1.044}$Ge$_{0.93}$Si$_{0.07}$O$_4$: Mn | 360-400 | 101.5 | 660 | 661 |
| Cu$_{0.46}$Sr$_{0.54}$Ge$_{0.6}$Si$_{0.4}$O$_3$: Mn | 360-400 | 103 | 658 | 655 |
| Cu$_{0.002}$Sr$_{0.998}$Ba$_{0.99}$Ca$_{0.01}$Si$_{0.98}$Ge$_{0.02}$O$_4$: Eu | 360-470 | 102 | 538 | 533 |
| Cu$_{1.45}$Mg$_{26.55}$Ge$_{9.4}$Si$_{0.6}$O$_{48}$: Mn | 360-400 | 102 | 660 | 657 |
| Cu$_{1.2}$Mg$_{26.8}$Ge$_{8.9}$Si$_{1.1}$O$_{48}$: Mn | 360-400 | 103.8 | 670 | 656 |
| Cu$_4$Mg$_{20}$Zn$_4$Ge$_5$Si$_{2.5}$O$_{38}$F$_{10}$: Mn | 360-400 | 101.5 | 658 | 655 |
| Pb$_{0.001}$Ba$_{0.849}$Zn$_{0.05}$Sr$_{1.1}$Ge$_{0.04}$Si$_{0.96}$O$_4$: Eu | 360-470 | 101.8 | 550 | 545 |
| Cu$_{0.05}$Mg$_{4.95}$GeO$_6$F$_2$: Mn | 360-400 | 100.5 | 655 | 653 |
| Cu$_{0.05}$Mg$_{3.95}$GeO$_{5.5}$F: Mn | 360-400 | 100.8 | 657 | 653 |

In some embodiments, the lead- and/or copper-containing phosphates may be generally characterized according to formula (20)

$$a(M'O).b(M''_2O).c(M''X).d(P_2O_5).e(M'''O).\\f(M''''_2O_3).g(M'''''O_2).h(M''''''_xO_y) \quad (20)$$

wherein M' may be Pb, Cu, and/or any combination thereof; M'' may be Li, Na, K, Rb, Cs, Au, Ag, and/or any combination thereof; M''' may be Be, Mg, Ca, Sr, Ba, Zn, Cd, Mn, and/or any combination thereof; M'''' may be Sc, Y, B, Al, La, Ga, In, and/or any combination thereof; M''''' may be Si, Ge, Ti, Zr, Hf, V, Nb, Ta, W, Mo, and/or any combination thereof; M'''''' may be Bi, Sn, Pr, Sm, Eu, Gd, Dy, Ce, Th, and/or any combination thereof, X may be F, Cl, Br, I, and/or any combination thereof; $0<a\leq2$; $0\leq b\leq12$; $0\leq c\leq16$; $0<d\leq3$; $0\leq e\leq5$; $0\leq f\leq3$; $0\leq g\leq2$; $0<h\leq2$; $1\leq x\leq2$; and $1\leq y\leq5$.

EXAMPLES OF PREPARATION

Preparation of the Luminescent Material Having Formula (21)

$$Cu_{0.02}Ca_{4.98}(PO_4)_3Cl: Eu \quad (21)$$

Starting materials: CuO, CaCO$_3$, Ca$_3$(PO$_4$)$_2$, CaCl$_2$, Eu$_2$O$_3$, and/or any combination thereof, The starting materials in the form of oxides, phosphates, and/or carbonates and chlorides may be mixed in stoichiometric proportions together with small amounts of flux. The mixture may be fired in an alumina crucible at about 1,240° C. in reducing atmosphere for about 2 hours. After that the material may be milled, washed, dried and sieved. The luminescent material may have an emission maximum at about 450 nm.

TABLE 19 copper-containing doped $Eu^{2+}$-activated chlorophosphate compared with $Eu^{2+}$-activated chlorophosphate without copper at about 400 nm excitation wavelength

|  | Copper-containing compound $Cu_{0.02}Ca_{4.98}(PO_4)_3Cl$: Eu | Compound without copper $Ca_5(PO_4)_3Cl$: Eu |
|---|---|---|
| Luminous density (%) | 101.5 | 100 |
| Wavelength (nm) | 450 | 447 |

Meanwhile, the phosphor of the light emitting device can comprise aluminate, silicate, antimonate, germanate, phosphate type chemical compound, and any combination thereof.

Figure 6:
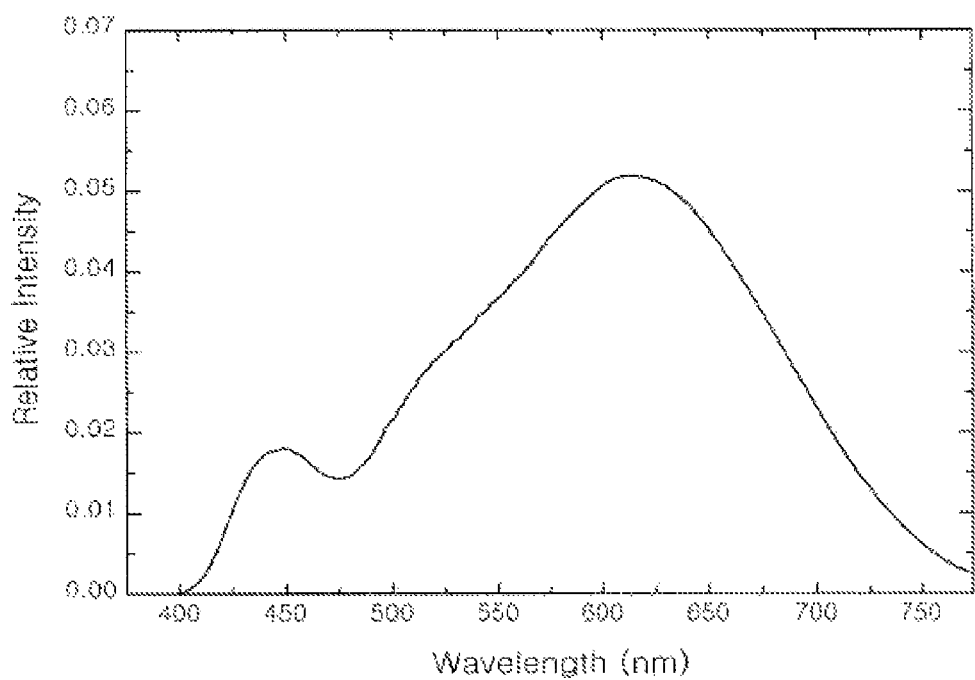
FIG. 6 shows emitting spectrum of a light emitting device with luminescent material.

FIG. 6 is one of the embodiment's emission spectrum according to the invention, which the phosphor is used for the light emitting device. The embodiment may have a light emitting diode with 405 nm wavelength and the phosphor, which is mixture of the selected multiple chemical compounds in proper ratio. The phosphor may be composed of $Cu_{0.05}BaMg_{1.95}Al_{16}O_{27}$: Eu which may have peak wavelength at about 451 nm, $Cu_{0.03}Sr_{1.5}Ca_{0.47}SiO_4$: Eu which may have peak wavelength at 586 nm, $Pb_{0.006}Ca_{0.6}Sr_{0.394}Sb_2O_6$: $Mn^{4+}$ which may have peak wavelength at about 637 nm, $Pb_{0.15}Ba_{1.84}Zn_{0.01}Si_{0.99}Zr_{0.01}O_4$: Eu which may have peak wavelength at around 512 nm, and $Cu_{0.2}Sr_{3.8}Al_{14}O_{25}$: Eu which may have peak wavelength at about 494 nm.

In such an embodiment, part of the initial about 405 nm wavelength emission light from the light emitting diode is absorbed by the phosphor, and it is converted to longer $2^{nd}$ wavelength. The $1^{st}$ and $2^{nd}$ light is mixed together and the desire emission is produced. As the shown FIG. 6, the light emitting device convert the $1^{st}$ UV light of 405 nm wavelength to wide spectral range of visible light, that is, white light, and at this time the color temperature is about 3,000K and CRI is about 90 to about 95.

Figure 7:
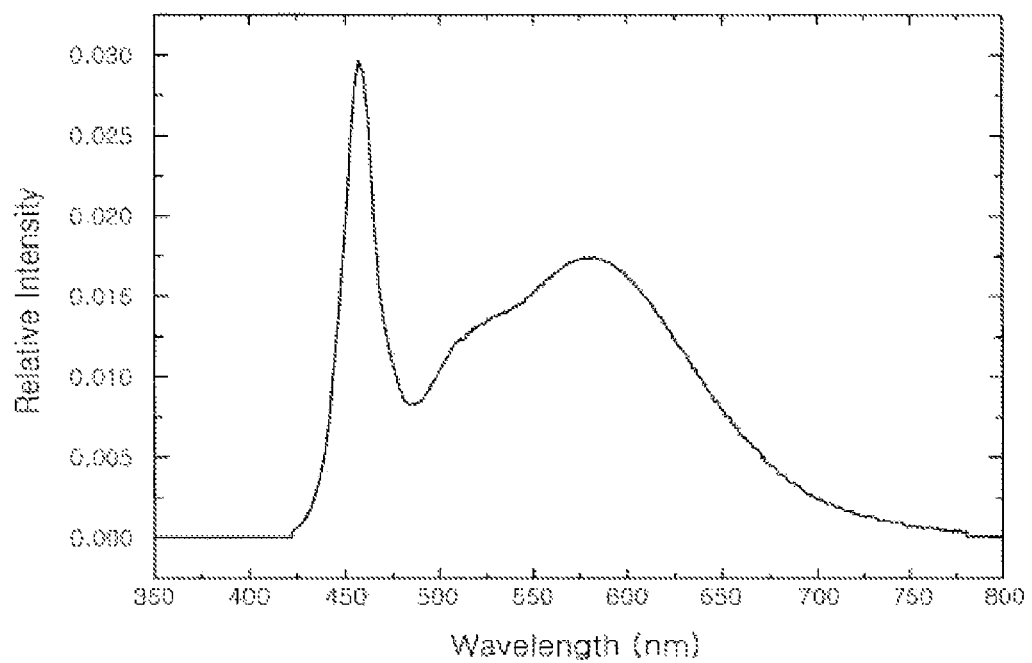
FIG. 7 shows emitting spectrum of the light emitting device with luminescent material according to another embodiment.

FIG. 7 is another embodiment's emission spectrum, which the phosphor is applied for the light emitting device. The embodiment may have a light emitting diode with about 455 nm wavelength and the phosphor, which is mixture of the selected multiple chemical compounds in proper ratio.

The phosphor is composed of $Cu_{0.05}Sr_{1.7}Ca_{0.25}SiO_4$: Eu which may have peak wavelength at about 592 nm, $Pb_{0.1}Ba_{0.95}Sr_{0.95}Si_{0.998}Ge_{0.002}O_4$: Eu which may have peak wavelength at about 527 nm, and $Cu_{0.05}Li_{0.002}Sr_{1.5}Ba_{0.448}SiO_4$: Gd, Eu which may have peak wavelength at about 557 nm.

In such an embodiment, part of the initial about 455 nm wavelength emission light from the light emitting diode is absorbed by the phosphor, and it is converted to longer $2^{nd}$ wavelength. The $1^{st}$ and $2^{nd}$ light is mixed together and the desire emission is produced. As the shown FIG. 7, the light emitting device convert the 1st blue light of about 455 nm wavelength to wide spectral range of visible light, that is, white light, and at this time the color temperature is about 4,000K to about 6,500K and CRI is about 86 to about 93.

TABLE 20 copper- and/or lead-containing phosphates excitable by long wave ultraviolet and/or by visible light and their luminous density in % at about 400 nm excitation wavelength

| Composition | Possible excitation range (nm) | Luminous density at 400 nm excitation compared with compounds not containing copper/lead (%) | Peak wave length of lead-/copper- doped materials (nm) | Peak wave length of materials without lead/copper (nm) |
|---|---|---|---|---|
| $Cu_{0.02}Sr_{4.98}(PO_4)_3Cl$: Eu | 360-410 | 101.5 | 450 | 447 |
| $Cu_{0.2}Mg_{0.8}BaP_2O_7$: Eu, Mn | 360-400 | 102 | 638 | 635 |
| $Pb_{0.5}Sr_{1.5}P_{1.84}B_{0.16}O_{6.84}$: Eu | 360-400 | 102 | 425 | 420 |
| $Cu_{0.5}Mg_{0.5}Ba_2(P,Si)_2O_8$: Eu | 360-400 | 101 | 573 | 570 |
| $Cu_{0.5}Sr_{9.5}(P,B)_6O_{24}Cl_2$: Eu | 360-410 | 102 | 460 | 456 |
| $Cu_{0.5}Ba_3Sr_{6.5}P_6O_{24}(F,Cl)_2$: Eu | 360-410 | 102 | 443 | 442 |
| $Cu_{0.05}(Ca,Sr,Ba)_{4.95}P_3O_{12}Cl$: Eu, Mn | 360-410 | 101.5 | 438, 641 | 435, 640 |
| $Pb_{0.1}Ba_{2.9}P_2O_8$: Eu | 360-400 | 103 | 421 | 419 |

The phosphor of the light emitting device exemplarily described herein can be applied by single chemical compound or mixture of plurality of single chemical compound besides the embodiments in relation to FIG. 6 and FIG. 7, which are explained above.

According to the description above, light emitting device with wide range of color temperature about 2,000K to about 8,000K or about 10,000K and superior color rendering index of greater than about 60 (e.g., between about 60 and about 90, or greater than about 90, or between about 90 and about 95) can be realized by using the lead- and/or copper-containing chemical compounds.

In such a wavelength conversion, the light emitting device exemplarily described herein is capable of use in mobile phones, note book computers and electronic devices such as home appliance, stereo, telecommunication products, as well as in custom display's key pad and back light applications. Moreover, the light emitting device exemplarily described herein can be applied in automobiles, medical instruments and illumination products.

In addition, the chemical compounds exemplarily described herein can be incorporated within paint as a pigment capable of converting wavelengths of light.

According to the embodiments exemplarily described above, the chemical can increase the stability of the light emitting device against water, humidity, vapor as well as other polar solvents.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description, with each claim standing on its own as a separate preferred embodiment of the invention.

What is claimed is:

1. A light emitting device, comprising:
a light emitting diode to emit light; and
a phosphor to change a wavelength of the light, the phosphor covering at least a portion of the light emitting diode, the phosphor comprising:
a compound comprising a host lattice and a luminescent ion, the luminescent ion comprising at least one rare earth element within the host lattice,
wherein the host lattice comprises first ions and oxygen,
wherein a portion of the first ions are substituted by copper ions,
wherein the compound is to emit light upon excitation with ultraviolet light or visible light, due to direct-type transitions, f-d transitions, or charge transfer transitions,
wherein the luminescent ion does not comprise copper, and
wherein the compound has the formula:

a(M'O).b(M''$_2$O) .c(M''X) .4-a-b-c(M'''O) .7(Al$_2$O$_3$) .d(B$_2$O$_3$) .e(Ga$_2$O$_3$) .f(SiO$_2$) .g(GeO$_2$) .h(M''''$_x$O$_y$), wherein:

M' is Cu or a combination of Cu and Pb;
M'' is Li, Na, K, Rb, Cs, Au, Ag, or any combination thereof;
M''' is Be, Mg, Ca, Sr, Ba, Zn, Cd, Mn, or any combination thereof;
M'''' is Pr, Nd, Pm, Sm, Eu, Gd, Tb, Dy, Ho, Er, Tm, Yb, or any combination thereof, or is at least one of Pr, Nd, Pm, Sm, Eu, Gd, Tb, Dy, Ho, Er, Tm, and Yb in combination with at least one of Bi, Sn, Sb, Sc, Y, La, Ce, In, and Lu;
X is F, Cl, Br, I, or any combination thereof;
0<a≤4;
0≤b≤2;
0≤c≤2;
0≤d≤1;
0≤e≤1;
0≤f≤1;
0≤g≤1;
0<h≤2;
1≤x≤2; and
0≤y≤5.

2. A light emitting device, comprising:
a light emitting diode to emit light; and
a phosphor to change a wavelength of the light, the phosphor covering at least a portion of the light emitting diode, the phosphor comprising:
a compound comprising a host lattice and a luminescent ion, the luminescent ion comprising at least one rare earth element within the host lattice,
wherein the host lattice comprises first ions and oxygen,
wherein a portion of the first ions are substituted by copper ions,
wherein the compound is to emit light upon excitation with ultraviolet light or visible light, due to direct-type transitions, f-d transitions, or charge transfer transitions,
wherein the luminescent ion does not comprise copper, and
wherein the compound has the formula:

a(M'O) .b(M''O) .c(Al$_2$O$_3$) .d(M'''$_2$O$_3$) .e(M''''O$_2$) .f(M'''''$_x$O$_y$), wherein:

M' is Cu or a combination of Cu and Pb;
M'' is Be, Mg, Ca, Sr, Ba, Zn, Cd, Mn, or any combination of thereof;
M''' is B, Ga, In, or any combination thereof;
M'''' is Si, Ge, Ti, Zr, Hf, or any combination thereof;
M''''' is Pr, Nd, Pm, Sm, Eu, Gd, Tb, Dy, Ho, Er, Tm, Yb, or any combination thereof, or is at least one of Pr, Nd, Pm, Sm, Eu, Gd, Tb, Dy, Ho, Er, Tm, and Yb in combination with at least one of Sc, Y, La, Ce, and Lu;
0<a≤1;
0≤b≤2;
0<c≤8;
0≤d≤1;
0≤e≤1;
0<f≤2;
1≤x≤2; and
1≤y≤5.

3. A light emitting device, comprising:
a light emitting diode to emit light; and
a phosphor to change a wavelength of the light, the phosphor covering at least a portion of the light emitting diode, the phosphor comprising:
a compound comprising a host lattice and a luminescent ion, the luminescent ion comprising at least one rare earth element within the host lattice,
wherein the host lattice comprises first ions and oxygen,
wherein a portion of the first ions are substituted by copper ions,
wherein the compound is to emit light upon excitation with ultraviolet light or visible light, due to direct-type transitions, f-d transitions, or charge transfer transitions,
wherein the luminescent ion does not comprise copper, and
wherein the compound has the formula:

a(M'O) .b(M''$_2$O) .c(M''X) .d(Sb$_2$O$_5$) .e(M''' O) .f(M''''$_x$O$_y$), wherein:

M' is Cu or a combination of Cu and Pb;

M" is Li, Na, K, Rb, Cs, Au, Ag, or any combination thereof;

M''' is Be, Mg, Ca, Sr, Ba, Zn, Cd, Mn, or any combination thereof;

M'''' is Pr, Sm, Eu, Tb, Dy, Gd, or any combination thereof, or is at least one of Pr, Sm, Eu, Gd, Tb, and Dy in combination with at least one of Bi, Sn, Sc, Y, and La;

X is F, Cl, Br, I, or any combination thereof;

$0 < a \leq 1$;
$0 \leq b \leq 2$;
$0 \leq c \leq 4$;
$0 < d \leq 8$;
$0 \leq e \leq 8$;
$0 \leq f \leq 2$;
$1 \leq x \leq 2$; and
$1 \leq y \leq 5$.

4. The light emitting device of claim 1, wherein the divalent copper ions are to increase luminous density of the phosphor.

5. The light emitting device of claim 2, wherein the divalent copper ions are to increase luminous density of the phosphor.

6. The light emitting device of claim 3, wherein the divalent copper ions are to increase luminous density of the phosphor.

* * * * *